US009160301B2

(12) United States Patent
Tajima et al.

(10) Patent No.: US 9,160,301 B2
(45) Date of Patent: Oct. 13, 2015

(54) ACOUSTIC WAVE DEVICE

(75) Inventors: Motoyuki Tajima, Kanagawa (JP); Tooru Takezaki, Kanagawa (JP); Hitoshi Tsukidate, Kanagawa (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 289 days.

(21) Appl. No.: 13/616,265

(22) Filed: Sep. 14, 2012

(65) Prior Publication Data

US 2013/0106530 A1 May 2, 2013

(30) Foreign Application Priority Data

Nov. 1, 2011 (JP) ................................ 2011-240670

(51) Int. Cl.
*H03H 9/70* (2006.01)
*H03H 9/72* (2006.01)
*H03H 9/05* (2006.01)
*H03H 9/10* (2006.01)

(52) U.S. Cl.
CPC ........... *H03H 9/0571* (2013.01); *H03H 9/0576* (2013.01); *H03H 9/1042* (2013.01); *H03H 9/1085* (2013.01); *H03H 9/1014* (2013.01); *H03H 9/1071* (2013.01)

(58) Field of Classification Search
CPC . H03H 9/0571; H03H 9/0576; H03H 9/0547; H03H 9/0557; H03H 9/0561; H03H 9/0566; H03H 9/1042; H03H 9/1085; H03H 9/542; H03H 9/605; H03H 9/6483; H03H 9/706; H03H 9/725
USPC .................. 333/133, 193, 247, 187, 189, 195
See application file for complete search history.

(56) References Cited

U.S. PATENT DOCUMENTS

2006/0164182 A1* 7/2006 Kushitani et al. ............. 333/133
2009/0302970 A1* 12/2009 Hatano et al. ................. 333/133
2010/0319975 A1* 12/2010 Tsutsumi et al. ............. 174/260
2011/0227807 A1* 9/2011 Iwaki et al. ................... 343/850

FOREIGN PATENT DOCUMENTS

JP 2000-196407 A 7/2000

* cited by examiner

*Primary Examiner* — Barbara Summons
(74) *Attorney, Agent, or Firm* — Chen Yoshimura LLP

(57) ABSTRACT

An acoustic wave device includes: a multilayer structure that has plural surfaces which principal surfaces of plural layers provide; a chip including an acoustic wave filter and mounted on a first surface; a resin unit sealing the chip; a wiring pattern that is formed on a second surface and electrically connected to at least one of resonators; a ground pattern that is formed on the second surface along a part of the wiring pattern, and is away from the wiring pattern; and an external terminal that is formed on a third surface and electrically connected to the wiring pattern and the ground pattern, the third surface being disposed on an opposite side of the first surface with respect to the second surface; wherein a part of the wiring pattern that comes closest to the ground pattern is substantially formed in parallel with the ground pattern.

11 Claims, 10 Drawing Sheets

ACOUSTIC WAVE DEVICE

CROSS-REFERENCE TO RELATED APPLICATION

This application is based upon and claims the benefit of priority of the prior Japanese Patent Application No. 2011-240670, filed on Nov. 1, 2011, the entire contents of which are incorporated herein by reference.

FIELD

A certain aspect of the present invention relates to an acoustic wave device.

BACKGROUND

There is known an acoustic wave device which includes an acoustic wave filter using an acoustic wave such as a surface acoustic wave (SAW) or a bulk acoustic wave (BAW), as a filter of wireless equipment or the like including a cell-phone. A chip including the acoustic wave filter is flip-chip mounted on a multilayer structure having plural layers by bumps, the peripheral portions of the chip are sealed with resin, and hence the chip is packed. Each terminal of the acoustic wave filter is electrically connected to an external terminal provided on a surface opposite to a surface on which the chip is mounted, by wiring patterns formed inside the multilayer structure. Heat generated in the acoustic wave device is emitted through a metal pattern for heat dissipation formed on the multilayer structure on which the chip is mounted, for example (See Japanese Patent Application Publication No. 2000-196407).

In an acoustic wave device in which the chip including the acoustic wave filter is mounted on the multilayer structure and sealed by resin, it is desirable not to form a metal pattern on a contact portion between the multilayer structure and the resin from a viewpoint on the improvement of adhesion. Consequently, in a surface of the multilayer structure, a space which can form the metal pattern for heat dissipation is limited. On the other hand, the thinner and the longer the wiring pattern such as an inductor formed on the multilayer structure is, the larger a heat resistance becomes, whereby heat dissipation gets worse. Therefore, there is a case where the heat dissipation from the chip cannot be performed effectively, the acoustic wave device becomes a high temperature and electric power proofness gets worse.

SUMMARY OF THE INVENTION

According to an aspect of the present invention, there is provided an acoustic wave device including: a multilayer structure that laminates a plurality of layers and has a plurality of surfaces for forming wiring which respective principal surfaces of the plurality of layers provide; a chip that includes an acoustic wave filter and is mounted on a first surface, the first surface being a front surface of the multilayer structure; a resin unit that is formed on the first surface and seals the chip; a wiring pattern that is formed on a second surface different from the first surface and is electrically connected to at least one of resonators which constitute the acoustic wave filter; a ground pattern that is formed on the second surface along at least a part of the wiring pattern, the ground pattern being away from the wiring pattern; and an external terminal that is formed on a third surface different from the first and the second surfaces and is electrically connected to the wiring pattern and the ground pattern, the third surface being disposed on an opposite side of the first surface with respect to the second surface; wherein a part of the wiring pattern that comes closest to the ground pattern is substantially formed in parallel with the ground pattern.

DETAILED DESCRIPTION

First, a description is given of an acoustic wave device according to the comparative embodiment.

Figure 1:
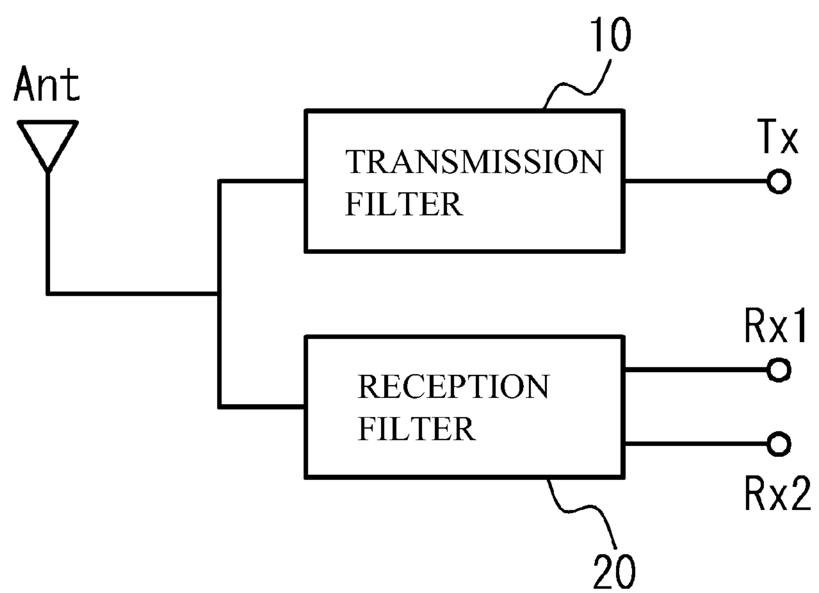
FIG. 1 is a block diagram illustrating the configuration of an acoustic wave device according to a comparative embodiment, a first embodiment and a second embodiment.

FIG. 1 is a block diagram illustrating the configuration of the acoustic wave device according to the comparative embodiment, a first embodiment and a second embodiment. The acoustic wave device is a duplexer connected to a common antenna terminal Ant. A transmission filter 10 is connected between the antenna terminal Ant and a transmission terminal Tx, and a reception filter 20 is connected between the antenna terminal Ant and reception terminals Rx1 and Rx2. In the above-mentioned example, although the terminal of the transmission side serves as a single input terminal and the terminals of the reception side serve as two output terminals, a concrete example of the duplexer is not limited to this.

Figure 2:
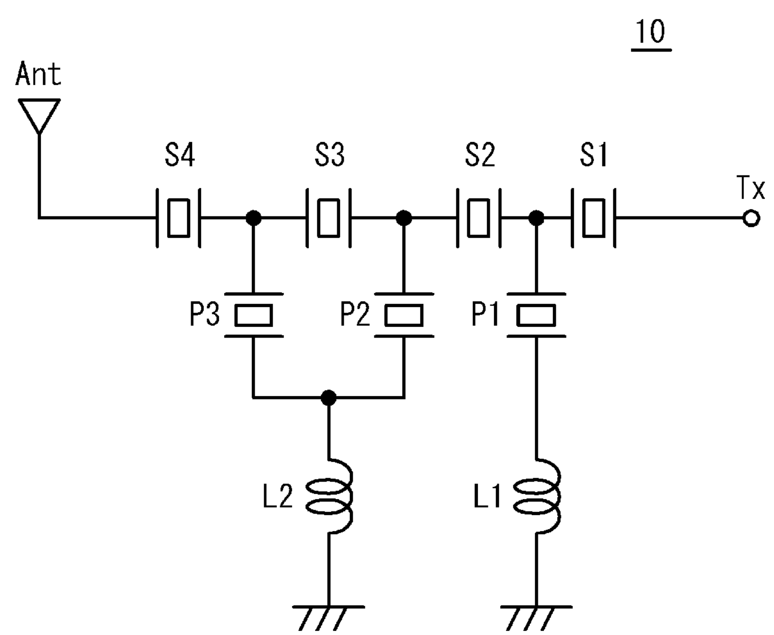
FIG. 2 is a circuit diagram illustrating the configuration of the acoustic wave device according to the comparative embodiment, the first embodiment and the second embodiment.

FIG. 2 is a circuit diagram illustrating the configuration of the transmission filter in the duplexer of FIG. 1. The configuration of the reception filter is omitted. The transmission filter 10 includes series resonators S1 to S4 connected in series with each other between the transmission terminal Tx and the antenna terminal Ant, and parallel resonators P1 to P3 connected between the respective series resonators. Among the parallel resonators P1 to P3, one end of the parallel resonator P1 (i.e., a terminal opposite to a terminal connected to the series resonators) is grounded via an inductor L1. One ends of the parallel resonators P1 and P2 are used in common and grounded via an inductor L2 different from the inductor L1.

Figure 3:
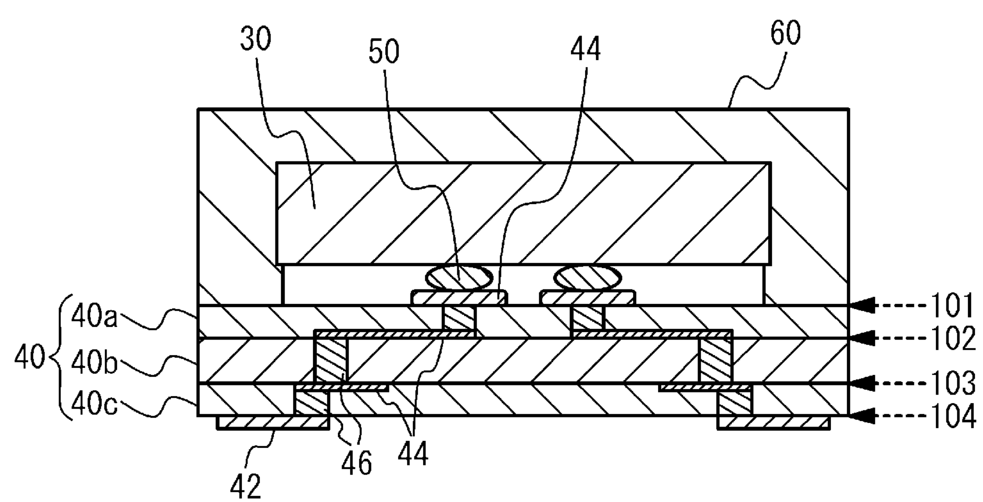
FIG. 3 is a schematic cross-section diagram illustrating the configuration of the acoustic wave device according to the comparative embodiment, the first embodiment and the second embodiment.

FIG. 3 is a schematic cross-section diagram illustrating the configuration of the acoustic wave device according to the comparative embodiment, the first embodiment and the second embodiment. As illustrated in FIG. 3, a chip 30 including the transmission filter 10 and the reception filter 20 in FIG. 1 is flip-chip mounted on a front surface of a multilayer structure 40 having plural layers (40*a* to 40*c*) via bumps 50. Peripheral portions of the chip 30 are sealed with a resin unit 60, and hence the chip 30 is packed by the multilayer structure 40 and the resin unit 60. For example, a lithium tantalite (LT) substrate can be used for the chip 30, and an insulated substrate such as a ceramic substrate can be used for the multilayer structure 40. In addition, for example, a metal bump such as Au (gold) or solder can be used for the bump 50, and epoxy resin can be used for the resin unit 60.

External terminals 42 are formed on a rear surface (i.e., a surface opposite to a surface on which the chip 30 is mounted) of the multilayer structure 40. Wiring patterns 44 formed on a front surface of each layer, and vias 46 connecting between an upper and a lower wiring patterns are formed inside the multilayer structure 40. In this description, it is assumed that the via indicates a structure where a metal electrode for up-and-down connection is formed inside a via hole. The bumps 50 are connected to the wiring patterns 44 on the front surface of the multilayer structure 40 (i.e., a mounted surface of the chip 30). Thereby, respective terminals of the transmission filter 10 and the reception filter 20 formed in the chip 30 are electrically connected to the external terminals 42 of the package. For example, Cu or Au can be used for the external terminals 42, the wiring patterns 44 and the vias 46, as material.

Here, the multilayer structure 40 has plural surfaces for forming wiring which respective principal surfaces of plural layers 40*a* to 40*c* provide. It is assumed that, in the plural surfaces, a die attach surface of the layer 40*a* on which the chip 30 is mounted is referred to as a surface 101. Similarly, a surface between the layer 40*a* and a layer 40*b* is referred to as a surface 102, a surface between the layer 40*b* and the layer 40*c* is referred to as a surface 103, and a principal surface exposed outside the layer 40*c* is referred to as a surface 104. The surface 104 is a rear surface of the multilayer structure 40, and is a surface on which the external terminals 42 are formed. Although the multilayer structure 40 of the present embodiment is configured to have three layers and four surfaces as described above, the number of layers of the multilayer structure is not limited to this.

Figure 4A:
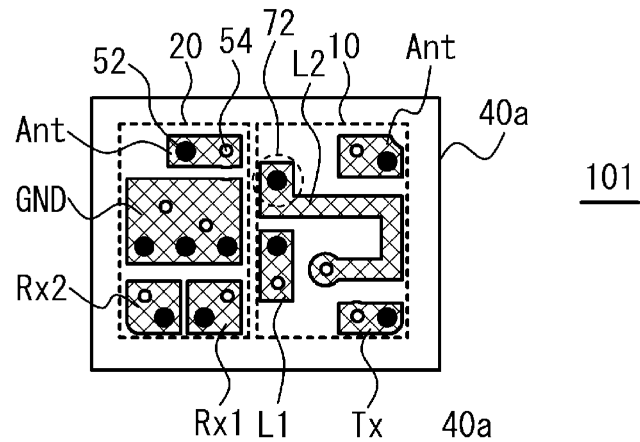
FIGS. 4A to 4D are plan views illustrating the configuration of the acoustic wave device according to the comparative embodiment (part 1)
Figure 4B:
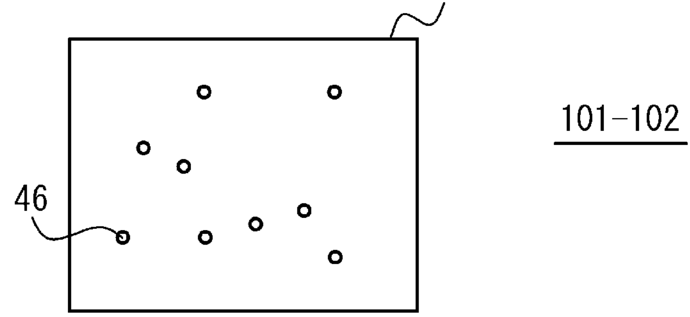
Figure 4C:
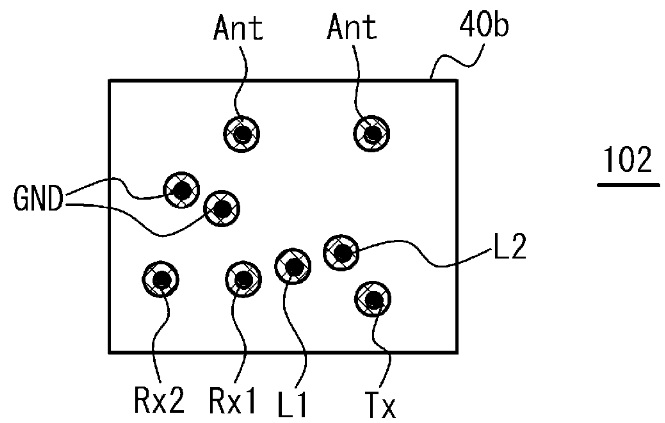
Figure 4D:
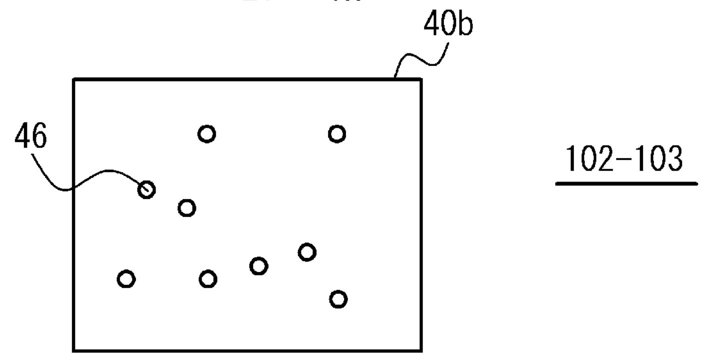
Figure 5A:
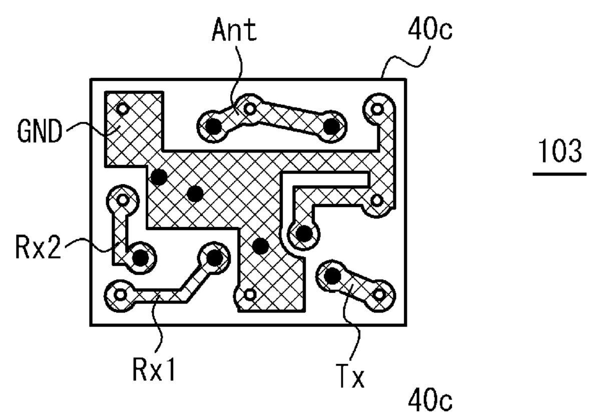
FIGS. 5A to 5C are plan views illustrating the configuration of the acoustic wave device according to the comparative embodiment (part 2)
Figure 5B:
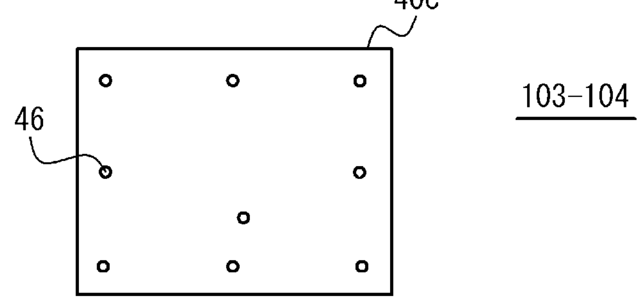

FIGS. 4A to 4D and FIGS. 5A to 5C are plan views illustrating the configuration of the acoustic wave device according to the comparative embodiment. FIGS. 4A, 4C, 5A and 5C are plan views corresponding to the surfaces 101, 102, 103 and 104, respectively. FIGS. 4B, 4D and 5B are diagrams indicating positions of the vias 46 formed between the above-mentioned surfaces. Each of FIGS. 4A to 4D and 5A to 5C is a diagram in which the multilayer structure 40 is transparently seen from a side of the chip 30 (subsequent figures are also illustrated in a same manner as this).

The codes in FIGS. 4A to 4D and FIGS. 5A to 5C correspond to those in the circuit diagrams of the filters illustrated in FIGS. 1 and 2. Each of the codes "Tx" in FIGS. 4A, 4C, 5A and 5C is a wiring pattern coupled to the transmission terminal Tx in FIGS. 1 and 2. The codes "Rx1" and "Rx2" in FIGS. 4A, 4C, 5A and 5C are wiring patterns coupled to the reception terminals Rx1 and Rx2 in FIGS. 1 and 2, respectively. Each of the codes "Ant" in FIGS. 4A, 4C, 5A and 5C is a wiring pattern coupled to the antenna terminal Ant in FIGS. 1 and 2. Each of the codes "L1" in FIGS. 4A and 4C is a wiring pattern of the inductor L1 in FIG. 2. Each of the codes "L2" in FIGS. 4A and 4C is a wiring pattern of the inductor L2 in FIG. 2. Each of the codes "GND" in FIGS. 4A, 4C, 5A and 5C is a ground pattern coupled to a ground potential. In FIG. 4A, each of the areas surrounded with painted-out circles (code 52) indicates a formation position of the bump 50. Each of the areas surrounded with outline circles (code 54) indicates a formation position of the via connected to the surface 102 under the surface 101. Also in the subsequent figures, each of the painted-out circles indicates a formation position of the via or the bump to be connected to an upper surface, and each of the outline circles indicates a formation position of the via to be connected to a lower surface.

The wiring patterns of the inductors L1 and L2 are formed at a side of the transmission filter 10 on the surface 101 which is the die attach surface, as illustrated in FIG. 4A. Generally, the thinly longer the wiring pattern, the larger an inductance value of the inductor. In the acoustic wave device, the inductance of the inductor L2 is larger than that of the inductor L1. The wiring pattern of the inductor L2 is formed longer than the inductor L1 so as to arrange on the surface 101.

Figure 5C:
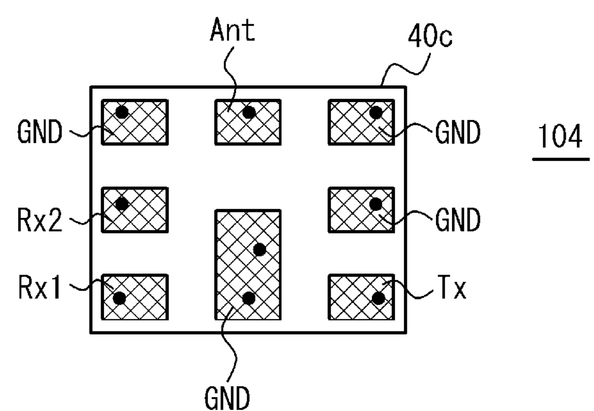

The circular wiring patterns are formed at the positions corresponding to the respective vias 46 on the surface 102, as illustrated in FIG. 4C. On the surface 103, the ground pattern GND is formed in a large range from the side of the transmission filter 10 to the side of the reception filter 20, as illustrated in FIG. 5A. The wiring patterns of the inductors L1 and L2 are connected to the ground pattern GND on the surface 103. The respective terminals (Ant, Tx, Rx1 and Rx2) of the transmission filter 10 and the reception filter 20 and electrode pads (i.e., the external terminals 42) corresponding to the ground terminal GND are formed on the surface 104 which is the rear surface of the multilayer structure 40, as illustrated in FIG. 5C.

Here, if it is assumed that the length of the wiring pattern is "L", the cross-section area thereof is "S" and the thermal conductivity thereof is "σ", the thermal resistance "R" of the wiring pattern is expressed by $R=L/(\sigma \cdot S)$ [° C./W]. Therefore, as the length L of the wiring pattern becomes long, heat conduction gets worse, the wiring pattern becomes high temperature, and hence it brings a result in which electric power proofness decreases.

In the acoustic wave device according to the comparative embodiment, the wiring patterns of the inductors L1 and L2 are formed on the surface 101. From a viewpoint of the improvement in adhesion between the multilayer structure 40 and the resin unit 60, it is desirable not to form the wiring pattern on a part of the surface 101 in contact with the resin unit 60. For this reason, a space on the surface 101 which can form the wiring pattern is limited. Since it is difficult to form the wiring pattern for heat dissipation, the wiring pattern of the inductor L2 having a large inductance becomes high temperature easily.

In the acoustic wave device according to the comparative embodiment, a result of thermal analytical simulation is described hereinafter. As preconditions of the simulation, each bump of the chip 30 was used as a heating element of 1.0 $W/m^3$, and the temperature of each terminal on the rear surface (i.e., the surface 104) of the multilayer structure 40 and the surrounding temperature were fixed at 25° C. An Au bump was used as each bump 50 and the diameter thereof was set as 90 μm. BT resin was used as the multilayer structure 40 and the thickness of each layer was set as 40 μm. Cu (Copper) was used as the wiring patterns 44 and the thickness thereof was set as 16 μm. The layouts of the wiring patterns illustrated in FIGS. 4A to 4D and FIGS. 5A to 5C were used as the layouts of the wiring patterns 44 in the multilayer structure 40, and the length of the inductor L2 was set as 1.4 mm. Accordingly, an edge part (i.e., an area indicated by a code 72) of the inductor L2 arranged long on the surface 101 became the highest temperature (+110° C.) in the wiring patterns.

As described above, the acoustic wave device according to the comparative embodiment has a problem that a part of the inductor in which the wiring pattern is long becomes high temperature and the electric power proofness gets worse. Such a phenomenon is remarkable especially in the acoustic wave device that has few space to form the wiring pattern for heat dissipation in order that a chip containing an acoustic wave filter is flip-chip mounted on the multilayer structure and is sealed by resin. In the following embodiment, a description is given of the structure for improving heat dissipation of the acoustic wave device as described above.

First Embodiment

The circuitry of the acoustic wave device according to the first embodiment is the same as FIGS. 1 and 2, the basic configuration of mounting according to the first embodiment is also the same as FIG. 3, and hence the description thereof is omitted. The acoustic wave device according to the first embodiment is different from that of the comparative embodiment in the layouts of the wiring patterns 44 in the multilayer structure 40. The layouts of the wiring patterns 44 are explained hereinafter in detail.

Figure 6A:
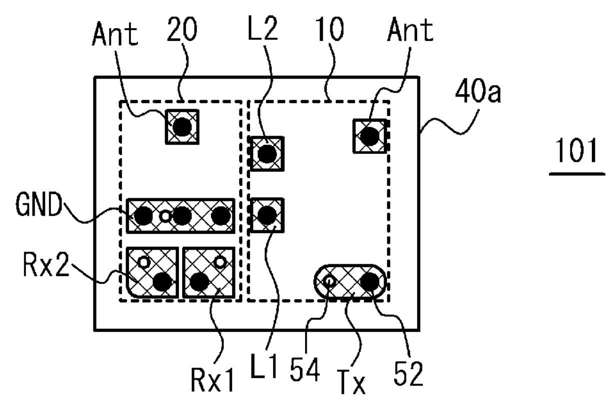
FIGS. 6A to 6D are plan views illustrating the configuration of the acoustic wave device according to the first embodiment (part 1)
Figure 6B:
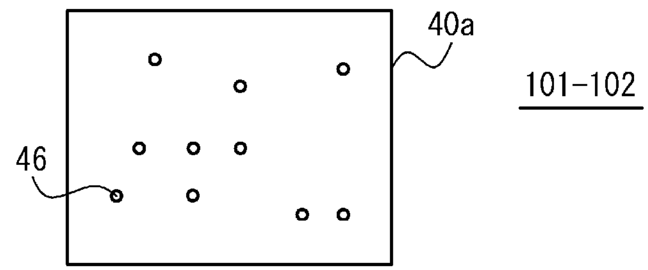
Figure 6C:
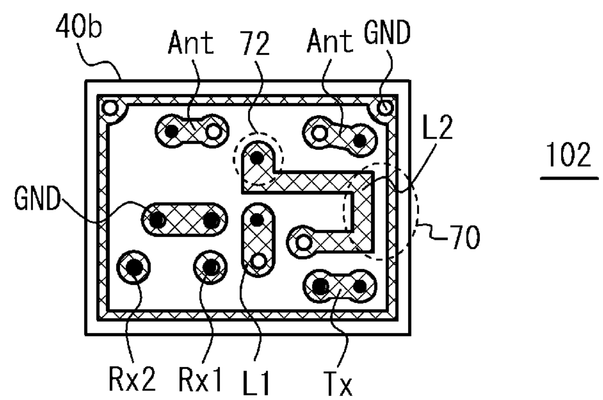
Figure 6D:
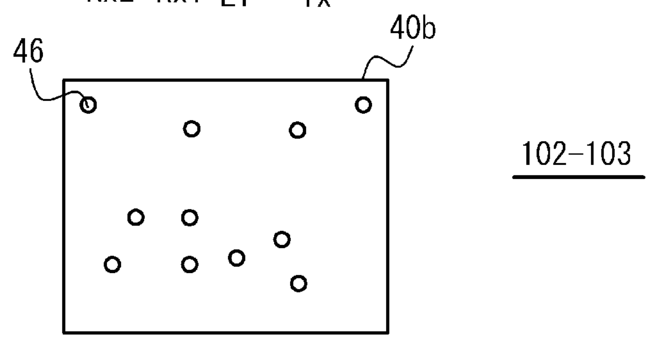
Figure 7A:
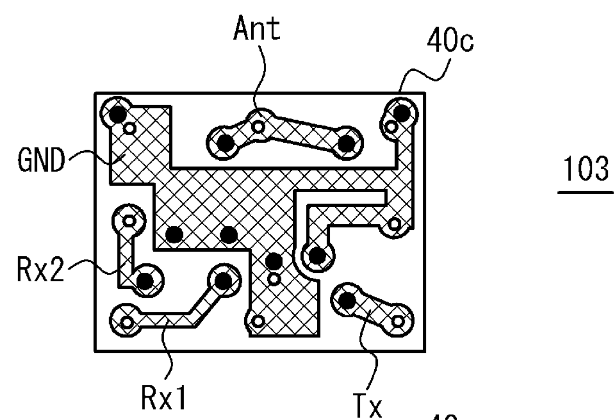
FIGS. 7A to 7C are plan views illustrating the configuration of the acoustic wave device according to the first embodiment (part 2)
Figure 7B:
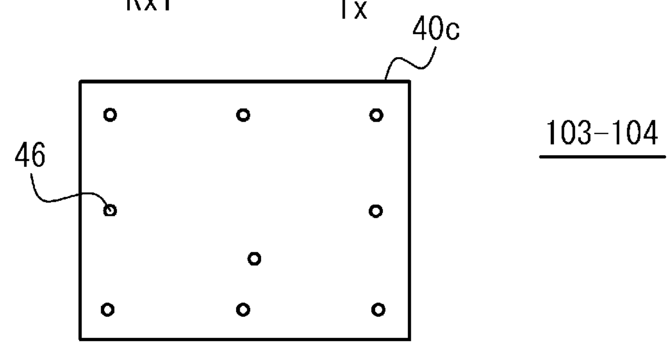

FIGS. 6A to 6D and FIGS. 7A to 7C are plan views illustrating the configuration of the acoustic wave device according to the first embodiment. As is the case with the comparative embodiment, FIGS. 6A, 6C, 7A and 7C are plan views corresponding to the surfaces 101, 102, 103 and 104, respectively. FIGS. 6B, 6D and 7B are diagrams indicating positions of the vias 46 formed between the above-mentioned surfaces. The meaning of the codes added to each wiring pattern is the same as the comparative embodiment.

The wiring patterns of the transmission terminal Tx, the antenna terminal Ant and the inductors L1 and L2 are formed at the side of the transmission filter 10 on the surface 101 which is the die attach surface, as illustrated in FIG. 6A. The inductor L2 is not arranged long as illustrated in the comparative embodiment (FIG. 4A), and the areas in the side of the transmission filter 10 on which the wiring patterns have been formed become smaller than the comparative embodiment.

The wiring pattern of the inductor L2 is arranged long on the surface 102 that is located immediately below the surface 101, as illustrated in FIG. 6C. Thereby, the inductance value of the inductor L2 can be increased as is the case with the comparative embodiment. On the other hand, the inductance value of the inductor L1 is smaller than that of the inductor L2 as is the case with the comparative embodiment, and the wiring pattern of the inductor L1 is also formed short.

Moreover, the ground pattern GND is formed on a circumference part of the surface 102 so as to surround the above-mentioned wiring patterns (Tx, Rx1, Rx2, Ant, L1 and L2). In an area illustrated with a code 70, a part of the ground pattern GND is formed along the wiring pattern of the inductor L2. The wiring pattern of the inductor L2 in the area 70 which comes closest to the ground pattern GND is substantially formed in parallel with the ground pattern GND. The "substantial parallel" indicates inclination that the heat can be emitted from the inductor L2 to the ground pattern GND efficiently, and the "substantial parallel" can include a perfect parallel state and an inclination state up to about ±30 degrees, for example (in the following description, the meaning of the "substantial parallel" is the same as this). An interval in the area 70 between the ground pattern GND and the wiring pattern of the inductor L2 is a minimum interval (a minimum rule) of the wiring patterns on the surface 102. Thereby, the ground pattern GND serves as a wiring pattern for emitting the heat generated in the inductor L2.

Figure 7C:
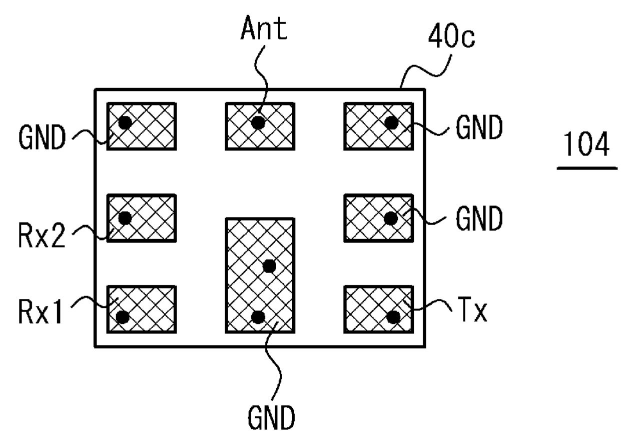

On the surface 103, the ground pattern GND is formed in a large range from the side of the transmission filter 10 to the side of the reception filter 20, as illustrated in FIG. 7A. The wiring patterns of the inductors L1 and L2 are connected to the ground pattern GND on the surface 103. The ground pattern GND on the surface 102 is also connected to the ground pattern GND on the surface 103 through the vias 46. The respective terminals (Ant, Tx, Rx1 and Rx2) of the transmission filter 10 and the reception filter 20 and an electrode pad corresponding to the ground terminal GND are formed on the surface 104 which is the rear surface of the multilayer structure 40, as illustrated in FIG. 7C.

In the acoustic wave device according to the first embodiment, a result of thermal analytical simulation is described hereinafter. The layouts of the wiring patterns 44 in the multilayer structure 40 illustrated in FIGS. 6A to 6D and FIGS. 7A to 7C are used. Other simulation conditions are the same as the comparative embodiment. Accordingly, the edge part (i.e., the area indicated by the code 72) of the inductor L2 became the highest temperature (+95° C.) in the wiring patterns. The highest temperature is a value smaller than that of the comparative embodiment.

According to the acoustic wave device according to the first embodiment, the wiring pattern that forms the inductor L2 having a large inductance value is formed on the surface 102 (i.e., a second surface) different from the surface 101 (i.e., a first surface) which is the die attach surface. Then, the ground pattern GND is formed along a part of the inductor L2, and the inductor L2 in the area 70 which comes closest to the ground pattern GND is substantially formed in parallel with the ground pattern GND. With the above-mentioned configuration, the heat generated in the inductor L2 can be emitted to the outside via the ground pattern GND. Therefore, even if the die attach surface (i.e., the first surface) has few space to form the wiring pattern for heat dissipation, the heat dissipation of the acoustic wave device can be improved. In addition, when the interval in the area 70 between the ground pattern GND and the wiring pattern of the inductor L2 is the minimum interval of the wiring patterns on the surface 102, the heat dissipation of the acoustic wave device can be further improved.

The first embodiment explained that the meaning of "substantial parallel" in the area 70 where the inductor L2 comes closest to the ground pattern GND includes an inclination up to about ±30 degrees. However, from a viewpoint of emitting the heat efficiently, it is desirable to make the above-mentioned inclination in the area 70 as small as possible in order to increase the area where the inductor L2 comes close to the ground pattern GND. Therefore, the inclination which the term "substantially parallel" means can be within ±20 degrees, ±10 degrees or ±5 degrees, for example. It is more desirable that the value of the inclination is smaller. Further, it is more desirable that the inductor L2 in the area 70 is in completely parallel with the ground pattern GND in the area 70 (i.e., the inclination is 0 degree).

In the first embodiment, the external terminals 42 are formed on the surface 104 (i.e., a third surface) different from the surface 102 on which the inductor L2 is formed. Then, the inductor L2 and the ground pattern GND are connected to each other on the surface 103 different from the surface 101, the surface 104, and the surface 102 on which the inductor L2 is formed. Thus, in the first embodiment, the die attach surface (i.e., the surface 101), the surface (i.e., the surface 102) on which the inductor L2 and the ground pattern GND for heat dissipation are formed, the surface (i.e., the surface 103) on which the inductor L2 and the ground pattern GND are connected are different from each other. Thereby, both of the formation of a wiring pattern having a large inductance and the improvement of the heat dissipation from the wiring pattern can be satisfied.

Second Embodiment

A second embodiment is an example of using a wiring pattern with a layout different from the first embodiment. The circuitry of the acoustic wave device according to the present embodiment is the same as FIGS. 1 and 2, the basic configuration of mounting is also the same as FIG. 3, and hence the description thereof is omitted.

Figure 8A:
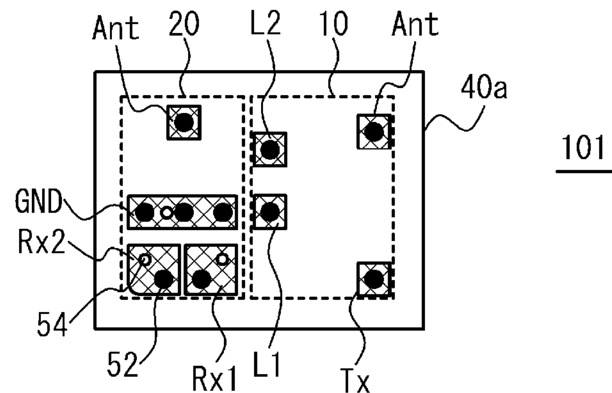
FIGS. 8A to 8D are plan views illustrating the configuration of the acoustic wave device according to the second embodiment (part 1)
Figure 8B:
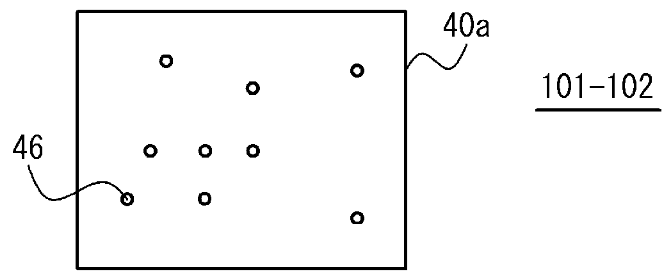
Figure 8C:
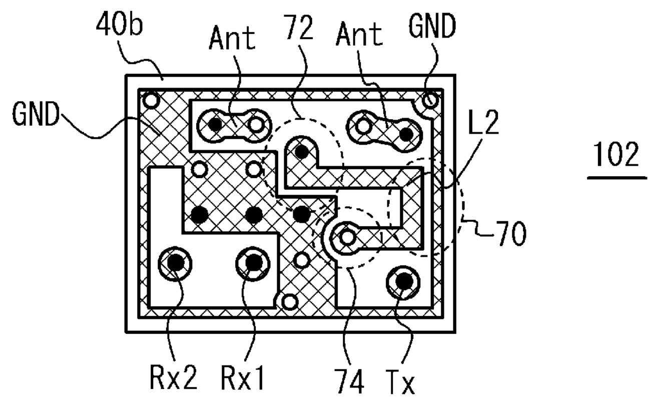
Figure 8D:
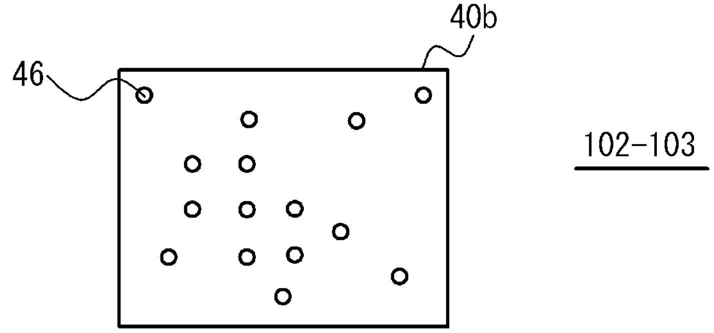
Figure 9A:
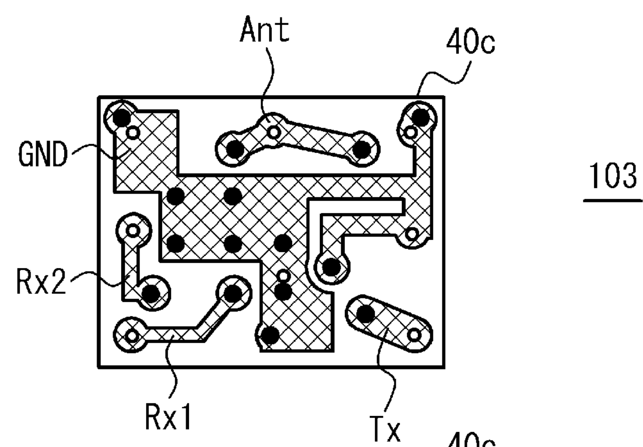
FIGS. 9A to 9C are plan views illustrating the configuration of the acoustic wave device according to the second embodiment (part 2)
Figure 9B:
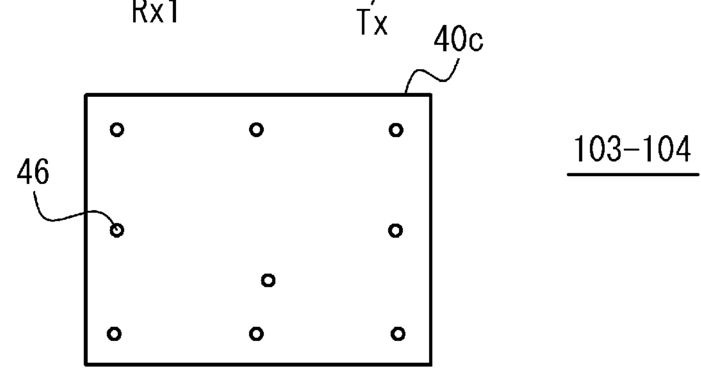
Figure 9C:
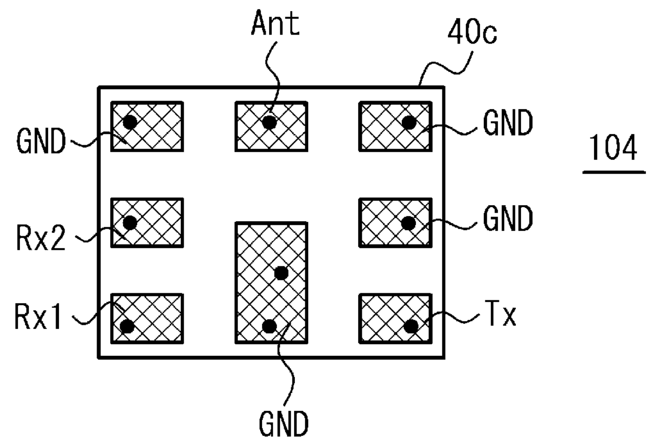

FIGS. 8A to 8D and FIGS. 9A to 9C are plan views illustrating the configuration of the acoustic wave device according to the second embodiment. As is the case with the first embodiment, FIGS. 8A, 8C, 9A and 9C are plan views corresponding to the surfaces 101, 102, 103 and 104, respectively. FIGS. 8B, 8D and 9B are diagrams indicating positions of the vias 46 formed between the above-mentioned surfaces. The meaning of the codes added to each wiring pattern is the same as the first embodiment.

In the second embodiment, the ground pattern GND is formed in a large area including not only the circumference part of the surface 102 but a central part of the surface 102 that is located immediately below the surface 101, as illustrated in FIG. 8C. Thereby, the inductor L2 is formed along the ground pattern GND in the areas indicated by the codes 72 and 74 in addition to the area indicated by the code 70. The wiring patterns of the inductor L2 in the areas 70, 72 and 74 which come closest to the ground pattern GND are substantially formed in parallel with the ground pattern GND. Here, in the area 74, a part of the ground pattern GND is circularly dented and formed in accordance with the form (i.e., circle) of an edge part of the wiring pattern of the inductor L2, so that the inductor L2 and the ground pattern GND are in parallel with each other. Moreover, each of intervals in the respective areas 70, 72 and 74 between the ground pattern GND and the wiring pattern of the inductor L2 is a minimum interval of the wiring patterns on the surface 102.

The inductor L2 and the ground pattern GND which are formed on the surface 102 are connected to each other on the surface 103 located immediately below the surface 102. The layouts of the wiring patterns on the surfaces other than the surface 102 are the same as those of the first embodiment, and hence a detailed description thereof is omitted.

In the acoustic wave device according to the second embodiment, a result of thermal analytical simulation is described hereinafter. The layouts of the wiring patterns 44 in the multilayer structure 40 illustrated in FIGS. 8A to 8D and FIGS. 9A to 9C are used. Other simulation conditions are the same as the comparative embodiment and the first embodiment. Accordingly, the edge part (i.e., the area indicated by the code 72 in FIG. 8C) of the inductor L2 arranged long on the surface 102 became the highest temperature (+83° C.) in the wiring patterns. The highest temperature is a value smaller than that of the comparative embodiment and the first embodiment.

According to the acoustic wave device of the second embodiment, the ground pattern GND for heat dissipation is formed on not only the circumference part of the surface 102 but the central part of the surface 102 (i.e., the second surface) on which the inductor L2 is formed. Accordingly, the areas in the ground pattern GND which are formed along the inductor L2 are placed on both of the outside and the inside of the wiring pattern of the inductor L2. Thereby, an area where the ground pattern GND for heat dissipation comes close to the inductor L2 increases, and hence the heat dissipation can be further improved, compared with the first embodiment.

In the second embodiment, the via for connecting the surface 102 and the surface 101 (i.e., the die attach surface) is formed on the area 74 in the inductor L2 which is formed along the ground pattern GND. The area 74 is most adjacent to the bump 50 as a resource of heat, and has a large heating value. Therefore, the ground pattern GND for heat dissipation is formed along the area 74, so that the heat dissipation can be further improved.

In addition, according to the acoustic wave device of the first and the second embodiments, the Common Mode Isolation (CMI) of the signal between the transmission terminal and the reception terminal (Tx-Rx1 and Tx-Rx2) can be improved compared with the comparative embodiment.

Figure 10:
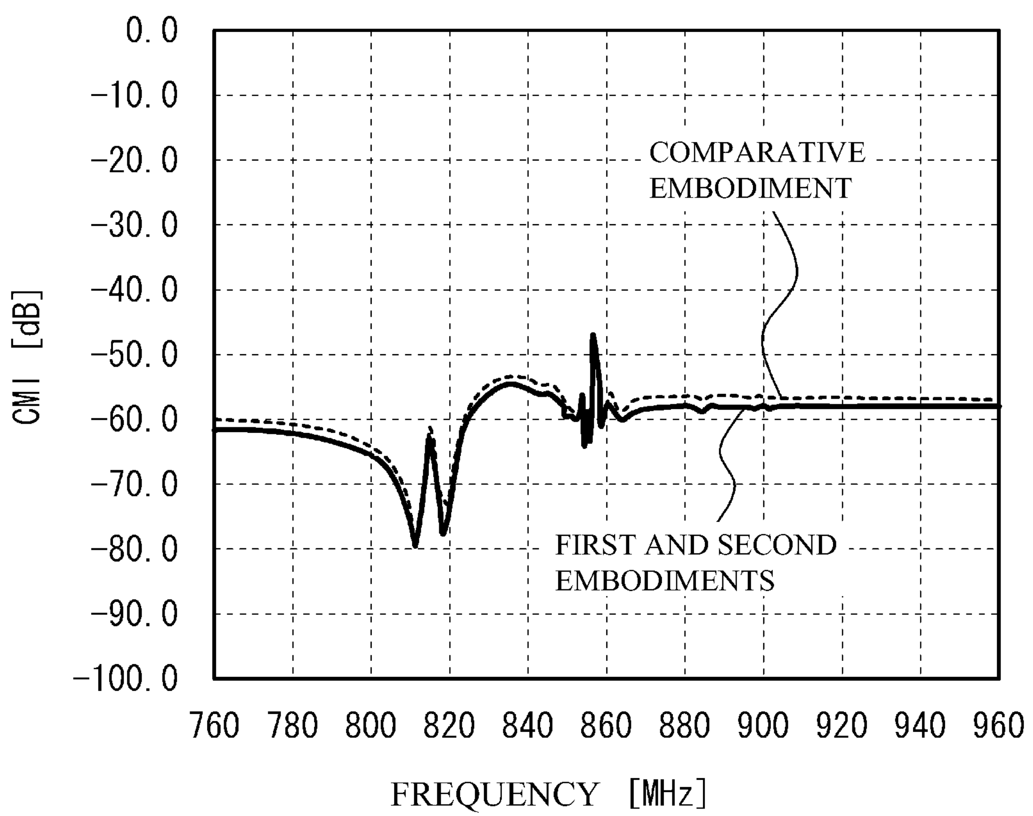
FIG. 10 is a graph illustrating CMI (Common Mode Isolation) characteristics of the acoustic wave device according to the comparative embodiment, the first embodiment and the second embodiment.

FIG. 10 is a graph illustrating a CMI (Common Mode Isolation) characteristic of the acoustic wave device according to the comparative embodiment, the first embodiment and the second embodiment. A horizontal axis of the graph indicates frequency [MHz] and a vertical axis of the graph indicates CMI [dB]. The CMI characteristics of the acoustic wave device according to the first embodiment and the second embodiment are the same as each other, and they are indicated by a solid line in the graph. The CMI characteristic of the acoustic wave device according to the comparative embodiment is indicated by a dotted line in the graph. The CMI characteristics according to the first embodiment and the second embodiment are improved about 1 dB, compared with the CMI characteristic according to the comparative embodiment, as illustrated in FIG. 10. This is because the area of the ground pattern GND in the multilayer structure 40 increases compared with the comparative embodiment and hence signal leak between the terminals is controlled by a shield effect.

Although in the first and the second embodiments, the example of the transmission filter is explained as the acoustic wave filter, the acoustic wave filter may be a filter (e.g. a reception filter) other than the transmission filter. However, since it is easy to generate heat of the wiring patterns by impressing a comparatively large electric power, it is suitable to adopt the configuration explained in the first and the second embodiments as the transmission filter. Although in the first and the second embodiments, the example of a ladder filter illustrated in FIG. 2 is explained as the acoustic wave filter, the concrete configuration of the ladder filter is not limited to this. For example, the parallel resonators P1 to P3 may be grounded via respective separate inductors, or one ends of the parallel resonators P1 to P3 may be used in common and grounded via an inductor. As long as the acoustic wave filter is a filter containing a resonator, the acoustic wave filter may have configuration other than this example. A SAW (Surface Acoustic Wave) resonator using a surface acoustic wave, and a FBAR (Film Bulk Acoustic Resonator) resonator using a bulk wave can be used as the resonator.

In the first and the second embodiments, the example of the inductor L2 is explained as the wiring pattern with the large heating value. However, as long as the wiring pattern is a wiring pattern electrically connected with at least one of resonators which constitute the filter, the wiring pattern may be an electrical element other than the inductor. Also in the first and the second embodiments, the inductor L2 and the ground pattern GND are connected to each other on the surface 103 (i.e., a fourth surface which is different from the first to third surfaces) placed between the surface 102 (i.e., the second surface on which the inductor L2 is formed) and the surface 104 (i.e., the third surface on which the external terminals 42 are formed). However, the inductor L2 and the ground pattern GND may be electrically connected to each other on at least a surface that is placed on the side of the third surface rather than the second surface. For example, the inductor L2 and the ground pattern GND may be electrically connected to each other on the surface 104 (i.e., the third surface) on which the external terminals 42 are formed.

In the first and the second embodiments, the example in which the chip 30 is flip-chip mounted on the multilayer structure 40 is explained. However, the chip 30 may be mounted on the multilayer structure 40 using a different method other than the method. Since a discharge course of the heat from the chip 30 is limited to a course passing the bump 50, it is suitable to adopt the configuration explained in the first and the second embodiments as the flip-chip mounting.

The embodiments of the present invention have been described. The present invention is not limited to these specific embodiments but may be varied or changed within the scope of the claimed invention.

What is claimed is:

1. An acoustic wave device comprising:

a multilayer structure that laminates a plurality of layers and has a plurality of surfaces for forming wiring which respective principal surfaces of the plurality of layers provide;

a chip that includes an acoustic wave filter and is mounted on a first surface, the first surface being a front surface of the multilayer structure;

a resin unit that is formed on the first surface and seals the chip;

a wiring pattern that is formed in contact with a second surface different from the first surface and is electrically connected to at least one of resonators which constitute the acoustic wave filter;

a ground pattern that is formed in contact with the second surface along at least a part of the wiring pattern, the ground pattern being away from the wiring pattern in a planar direction of the second surface, the ground pattern including a first portion surrounding the wiring pattern; and an external terminal that is formed on a third surface different from the first and the second surfaces and is electrically connected to the wiring pattern and the ground pattern, the third surface being disposed on an opposite side of the first surface with respect to the second surface, wherein a part of the wiring pattern that comes closest to the first portion of the ground pattern in the planar direction of the second surface and that is located in contact with the second surface is substantially formed in parallel with the first portion of the ground pattern.

2. The acoustic wave device according to claim 1, wherein the wiring pattern and the ground pattern are electrically connected to each other on the third surface.

3. The acoustic wave device according to claim 1, wherein the acoustic wave filter is a ladder filter in which a plurality of series resonators and a plurality of parallel resonators are connected in a shape of a ladder, and the wiring pattern electrically connects between at least one of the parallel resonators and the external terminal connected to a ground.

4. The acoustic wave device according to claim 1, wherein the acoustic wave filter is a transmission filter in a duplexer in which the transmission filter and a reception filter are connected to a common antenna terminal.

5. The acoustic wave device according to claim 1, wherein the part of the wiring pattern is connected to a via formed between the first surface and the second surface.

6. The acoustic wave device according to claim 1, wherein the at least one of resonators which constitute the acoustic wave filter is a surface acoustic wave resonator.

7. The acoustic wave device according to claim 1, wherein the at least one of resonators which constitute the acoustic wave filter is a film bulk acoustic resonator.

8. The acoustic wave device according to claim 1, wherein the chip is flip-chip mounted on the first surface.

9. The acoustic wave device according to claim 1, wherein:

the acoustic wave filter includes a transmission filter connected between an antenna terminal and a transmission terminal and a reception filter connected between the antenna terminal and a reception terminal; and the part of the wiring pattern is closer to the transmission filter than the reception filter.

10. The acoustic wave device according to claim 1, wherein the ground pattern further includes a second portion that is surrounded by the first portion, wherein another part of the wiring pattern that comes closest to the second portion of the ground pattern in the planar direction of the second surface and that is located in contact with the second surface is substantially formed in parallel with the second portion of the ground pattern.

11. An acoustic wave device comprising:

a multilayer structure that laminates a plurality of layers and has a plurality of surfaces for forming wiring which respective principal surfaces of the plurality of layers provide;

a chip that includes an acoustic wave filter and is mounted on a first surface, the first surface being a front surface of the multilayer structure;

a resin unit that is formed on the first surface and seals the chip;

a wiring pattern that is formed on a second surface different from the first surface and is electrically connected to at least one of resonators which constitute the acoustic wave filter;

a ground pattern that is formed on the second surface along at least a part of the wiring pattern, the ground pattern being away from the wiring pattern; and an external terminal that is formed on a third surface different from the first and the second surfaces and is electrically connected to the wiring pattern and the ground pattern, the third surface being disposed on an opposite side of the first surface with respect to the second surface, wherein a part of the wiring pattern that comes closest to the ground pattern is substantially formed in parallel with the ground pattern, and wherein an interval between the wiring pattern and the ground pattern in an area where the wiring pattern comes closest to the ground pattern is identical with a minimum interval between wiring patterns on the second surface.

* * * * *